United States Patent [19]

Wash et al.

[11] Patent Number: 4,964,139

[45] Date of Patent: Oct. 16, 1990

[54] MULTI-PURPOSE CIRCUIT FOR DECODING BINARY INFORMATION

[75] Inventors: Michael L. Wash, Pittsford; Fernando G. Silva, Rochester; Thomas J. Quattrini, Batavia, all of N.Y.

[73] Assignee: Eastman Kodak Company, Rochester, N.Y.

[21] Appl. No.: 344,773

[22] Filed: Apr. 27, 1989

[51] Int. Cl.$^5$ .............................................. H03K 7/06
[52] U.S. Cl. ..................................... 375/23; 375/110; 360/40; 329/313
[58] Field of Search ........................... 360/40, 41, 44; 328/109; 329/107, 313; 375/23, 110, 80

[56] References Cited

U.S. PATENT DOCUMENTS

| | | | |
|---|---|---|---|
| 3,357,003 | 12/1967 | Mac Arthur | 360/40 |
| 3,959,816 | 5/1976 | Spiecens | 360/44 |
| 3,996,613 | 12/1976 | Manning et al. | 360/40 |
| 4,040,100 | 8/1977 | Chan | 360/72.2 |
| 4,769,723 | 9/1988 | Tran | 360/41 |

Primary Examiner—Benedict V. Safourek
Assistant Examiner—Tesfaldet Bocure
Attorney, Agent, or Firm—Francis H. Boos, Jr.

[57] ABSTRACT

Electrical circuits suitable for decoding binary information, in accordance with either of two novel modulation methods. The novel modulation methods are referenced in the instant case, and it is explained that the methods may be used when an encoding or decoding information transfer rate may be dependent on unpredictable and variable transfer rate velocities and accelerations. The present electrical circuits provide a novel means to realize the utility of either of the modulation methods.

4 Claims, 4 Drawing Sheets

MULTI-PURPOSE CIRCUIT FOR DECODING BINARY INFORMATION

CROSS-REFERENCE TO RELATED APPLICATIONS

This application is related to application Ser. No. 206,407 filed Jun. 14, 1988, by Wash now abandoned; to application Ser. No. 206,408 filed Jun. 14, 1988, by Whitfield et al. now U.S. Pat. No. 4,876,997; to application Ser. No. 206,553 filed Jun. 14, 1988, by Whitfield, now U.S. Pat. No. 4,876,697; to application Ser. No. 206,646 filed Jun. 14, 1988 by Wash now abandoned; to application Ser. No. 327,073 filed on Mar. 22, 1989, by C. Chi; to application Ser. No. 327,071 filed on Mar. 22, 1989, by A. Whitfield; and to application Ser. No. 327,068 filed Mar. 22, 1989, by F. Silva. The entire disclosures of each of these applications are incorporated by reference herein. Each of these applications is copending and commonly assigned.

FIELD OF THE INVENTION

This invention relates to electrical circuits suitable for decoding binary information, in accordance with either of two novel modulation methods.

INTRODUCTION TO THE INVENTION

Novel methods for modulating binary data or information into a format suitable for encoding and decoding e.g., magnetic information or optical information, are disclosed in the above-cited application Ser. Nos. 206,407 to M. Wash, and 327,073 to C. Chi. The novel methods both feature self-clocking, velocity insensitive encoding and decoding. Electrical circuits that may be employed for realizing the decoding schemes set forth in the Wash method are disclosed in the above-cited application Ser. Nos. 206,553 and 206,646; while circuits for realizing the Chi decoding scheme are disclosed in Ser. No. 327,073. The electrical circuits of the present application, in contrast, have an advantage that they may be employed for decoding information that has been encoded in accordance with either the Wash or Chi methodologies. The novel, multi-purpose electrical circuits of the present invention decode the information, and preserve the self-clocking, velocity insensitive features of the novel methods.

SUMMARY OF THE INVENTION

The novel methods of Wash and Chi are first set forth, with examples, in order to provide a perspective for the present invention.

Accordingly, in one embodiment, Wash discloses a method for modulating binary data comprising first and second information, the method comprising:

(1) defining a bitcell as the time t between two adjacent clock transitions;

(2) writing a first clock transition at the beginning of the bitcell; and (3) encoding a binary data transition after the first clock transition in the ratio of $t_d/t$, where $t_d$ is the time duration between the first clock transition and the data transition, with the proviso that $t_d/t \neq 1/n$, where $1/n$ defines a line of demarcation between a data 0 bit and a data 1 bit.

Figure 1:
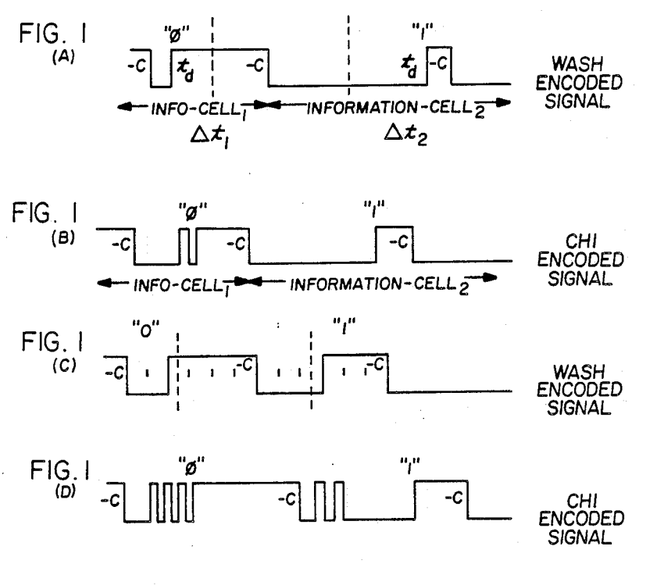
FIGS. 1A–D show encoding waveforms generated by the Wash and Chi methods.

An example of the Wash method is shown in FIG. 1A. Note that some of the Wash lexicography has been re-phrased in FIG. 1A, to emphasize and unify concepts that are generic to both the Wash and Chi methods (infra). For example, a "bitcell" is now referenced as an "information-cell". The FIG. 1A, accordingly, comprises an encoded signal comprising a succession of two information-cells, of varying duration. Each of the information-cells is demarcated by a pair of negative clock transitions. A first information, a data 0, is encoded in the first information-cell, while a second information, a data 1, is encoded in the second information-cell. Thus, by definition of the Wash method, the first information-cell encodes the data 0, since an information transition is written at a time $t_d/t < \frac{1}{2}$, i.e., at a time $t_d$ less than the half-way point of the first information-cell. Again, by definition, the second information-cell encodes the data 1, since an information transition is written at a time $t_d/t > \frac{1}{2}$, i.e., at a time $t_d$ greater than the half-way point of the second information-cell. Note that the encoding of the information transitions for both the first and second information-cells leaves invariant the negative clock transitions.

We now set forth the Chi method, and an example. In one aspect, Chi discloses a method for modulating binary data comprising first and second information, the method comprising:

(1) defining an event-cell as the time between two adjacent clock transitions, the clock transitions having a unique characteristic; and (2) selectively writing the information into the event-cell at an arbitrary time, by
  (i) generating a first event and a corresponding first read signal, in response to the first information; or
  (ii) generating a second event and a corresponding second read signal, in response to the second information.

An example of the Chi method is shown in FIG. 1B. Note that some of the Chi lexicography has FIG. 1B. Note that some of the Chi lexicography has been re-phrased in FIG. 1B, to emphasize and unify concepts that are generic to both the Chi and Wash methods (supra). For example, an "event-cell" is now referenced as an "information-cell". The FIG. 1B, accordingly, comprises an encoded signal comprising a succession of two information-cells, of varying duration. Each of the information-cells is demarcated by a pair of negative clock transitions. A first information, a data 0, is encoded in the first information-cell, while a second information, a data 1, is encoded in the second information-cell. Thus, by definition of the Chi method, the first information-cell encodes the data 0, since it comprises generating a first event at an arbitrary time, by generating three alternate information transitions; the first event realizing, downstream, a first read signal. Again, by definition, the second information-cell encodes the data 1, since it comprises generating a second event, at an arbitrary time, by generating a single information transition; the second event realizing, down-stream, a second read signal. Note that the encoding of the information transitions for both the first and second information-cells leaves invariant the negative clock transitions.

With the intent of providing a means for decoding an encoded signal, encoded either by way of the Wash or Chi methods, as exemplified in FIGS. 1A, B, we now disclose an electrical circuit suitable for decoding binary data comprising first and second information; which data has been encoded into an encoded signal, the encoded signal comprising:

(i) a succession of information-cells, each of which information-cells is demarcated by a pair of unique clock transitions; and wherein (ii) each information-cell is dedicated to encoding either a first information or a second information; the electrical circuit comprising:

(1) a reading means for reading the encoded signal and producing a read signal which corresponds to the encoded signal, so that the read signal comprises
   a succession of information-cells, each of which information-cells comprises a unique pair of clock transition components, and each of which information-cells comprises a first information component or a second information component;

(2) a detector means for interrogating the read signal and producing separate first and second output signals, wherein
   (i) the first output signal comprises the succession of unique clock transition components, and
   (ii) the second output signal comprises the first and second information components;

(3) a counting means connected to the detector means for
   (i) counting, by an arbitrary but known first formula, from a first clock transition component until the advent of an information component; and
   (ii) then counting, by an arbitrary but known second formula, from the advent of the information component until the advent of a second clock transition component;
   (iii) with the proviso that if there is no information component between subsequent clock transition components, then the counting between subsequent clock transition components is in accordance with the first formula; and (4) a computing means receiving inputs from the detector means and the counting means, for
   (i) identifying the succession of information-cells, and
   (ii) signifying each identified information-cell as being dedicated to either a first or second information, the signification based on a known relationship between the first and second formulas.

The present invention, as defined, has an advantage that it may be employed to decode a signal encoded either by way of the Wash or Chi methods, cited above. This versatility applies not only to the two illustrative encoded signals shown in FIGS. 1A, B, but extends to any of the numerous alternative encoding signals envisaged by either of the two methods. For example, the present invention can decode the more generalized, complex encoded signals shown in FIGS. 1C, D. In particular, FIG. 1C shows another Wash encoded signal, where an information 0 is written at the $\frac{1}{3}$ point of an information-cell, while an information 1 is written at the $\frac{2}{3}$ point of an information-cell. FIG. 1D, on the other hand, shows another Chi encoded signal, where an information 0 comprises an event comprising a large but odd number of information transitions, while an information 1 comprises an even number of bunched transitions with one stand-off single transition. The point is that the Wash and Chi methods can give rise to an indefinite number of alternative encoded signals, all within their generic formats respectively, and all capable of being readily decoded by the present invention.

The present invention, as defined, has a further advantage of preserving the self-clocking, velocity insensitive features of the Wash and Chi methods. This preservation factor is provided by the electrical circuit in the following way.

First, it is evident from the illustrative FIGS. 1A–D, that in the general case, an encoded signal comprises sequential information-cells defined by a variable time duration $\Delta t$. This variable time duration $\Delta t$ is a consequence of the information transfer rate in the encoding process being dependent on unpredictable and variable transfer rate velocities and accelerations. The present electrical circuit accommodates such unpredictable and variable transfer rates by way of a two-fold capability.

First, the electrical circuit identifies or re-creates, on the decoding end, the encoded, variable sequential information-cells. This is accomplished, inter alia, by way of the operation of the counting means and the computing means. For example, a second information-cell, having a time duration $\Delta t_2$ much greater than a first information-cell $\Delta t_1$, may be accommodated, i.e., identified or re-created on the decoding end, by simply continuing to count, in a quite mechanical fashion, according to the first and second formulas, until the time duration $\Delta t_2$, or $\Delta t_1$, between subsequent clock transition components, has elapsed.

Second, the electrical circuit, having identified the succession of variable information-cells, signifies each identified information-cell as being dedicated to either a first or second information. The signification is based on a known relationship between the first and second formulas. For example, for the Wash encoded signal, the signification turns on knowing where the line of demarcation that uniquely sets off the first and second informations, has been invariantly located within a variable information-cell. To this end, the first formula can effect a counting regime that is a measure of the invariant line of demarcation; and the first formula, in ratio to a combined count of the first and second formulas, can re-create the line of demarcation with respect to the entire and variable information-cell, thus signifying the instant information-cell as being either a first or second information. For the Chi encoded signal, on the other hand, a simple quantitative comparison between the yield of the first and second formulas, can provide the signification of a first or second information in a variable information-cell.

The present invention has a further advantage of having a bi-directional decoding capability, as well as a uni-directional decoding capability. Further, the decoding may be accomplished in "real-time", i.e., in contrast to the aforementioned decoding schemes disclosed in Ser. Nos. 206,553 or 206,646. Thus, the present electrical circuits do *not* "look-back", in analeptic fashion, to re-create an information-cell, but rather provide a proleptic or real-time capability, for determining the signification of the information-cell. This is true because of a direct counting capability inherent in the first and second formulas.

BRIEF DESCRIPTION OF THE DRAWINGS

The invention is illustrated in the accompanying drawing, in which.

DETAILED DESCRIPTION OF THE INVENTION

Figure 2:
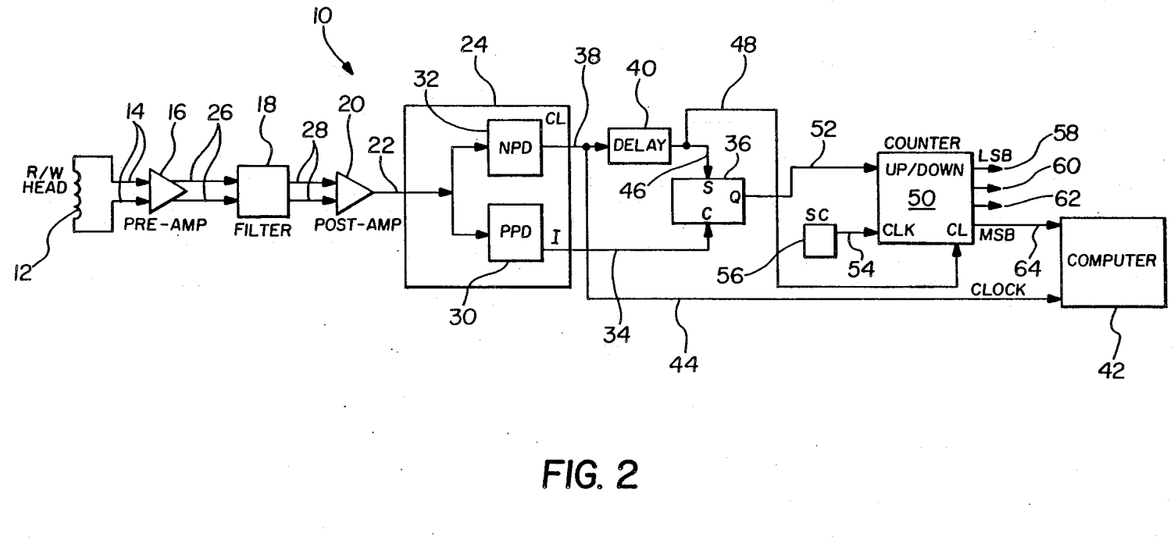
FIG. 2 is a circuit diagram of the present invention.

Attention is now directed to FIG. 2, which shows an electrical circuit 10 of the present invention. The structure of the circuit 10 is first disclosed, followed by its operation.

Accordingly, the circuit 10 comprises a magnetic read/write head 12. The head 12 reads an encoded signal, as explained more fully below, and outputs a read signal along a line pair 14. The read signal is amplified by a pre-amplifier 16, filtered by a filter circuit 18, again amplified by a post-amplifier 20, and inputted along a line 22 to a detector means 24. Appropriate line pairs for processing the read signal are provided by line pairs 26, 28.

The detector means 24, in turn, comprises a positive threshold peak detector 30, and a negative threshold peak detector 32 connected in parallel to the positive threshold peak detector 30. The positive threshold peak detector 30 outputs an information pulse train signal, along a line 34, for input to a clear terminal of a flip-flop 36; while the negative peak detector 32 outputs a clock pulse train signal, along a line 38, for input to a time delay 40, and for input to a computer 42, along a line 44.

The time delay 40, in turn, provides an input, along a line 46, to a set terminal of the flip-flop 36, as well as an input, along a line 48, to a clear terminal of a counter 50. The counter 50, further receives both an input to an "up/down" terminal, along a line 52, from an output terminal Q of the flip-flop 36, and an input to a clock terminal, along a line 54, from a systems clock 56. The counter 50 provides counting outputs from a least significant bit (LSB) to a most significant bit (MSB), along lines 58, 60, 62, 64 respectively, the last also inputted to the computer 42.

The operation of the FIG. 2 circuit 10 will now be disclosed, first with respect to the Wash method, and then with respect to the Chi method, and reference additionally will be made to the waveforms shown in FIGS. 3A–E.

Figure 3A:
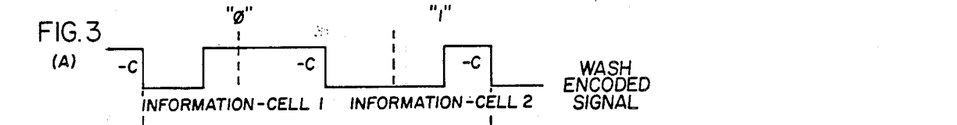
FIGS. 3A–E show waveforms generated by the FIG. 2 circuit, when decoding a Wash encoded signal.

An objective of the operation of the circuit 10 is to first decode binary data comprising first and second informations, which data has been encoded into an encoded signal shown in FIG. 3A, in accordance with the Wash method. FIG. 3A is, in fact, a reproduction of FIG. 1C supra, and shows the information 0 encoded in the first information-cell at the $\frac{1}{3}$ location, with the line of demarcation at the point $\frac{1}{2}$, and the information 1 encoded in the second information-cell at the $\frac{2}{3}$ location, the line of demarcation again at the point $\frac{1}{2}$. Negative clock transitions set-off the two information-cells.

The FIG. 3A encoded signal is introduced to the FIG. 2 read/write head 12. The head 12 reads the FIG. 3A encoded signal, and produces a read signal (FIG. 3B) which corresponds to the encoded signal. Therefore, the FIG. 3B read signal comprises a succession of two information-cells, each of which information-cells comprises a pair of negative clock transition components. Further, the read signal comprises a first read signal information component, corresponding to, and derived from, the information 0 and therefore located at the $\frac{1}{3}$ point of the first information-cell; and, a second read signal information component, corresponding to, and derived from, the information 1 and therefore located at the $\frac{2}{3}$ point of the second information-cell.

Figures 3B, 3C:
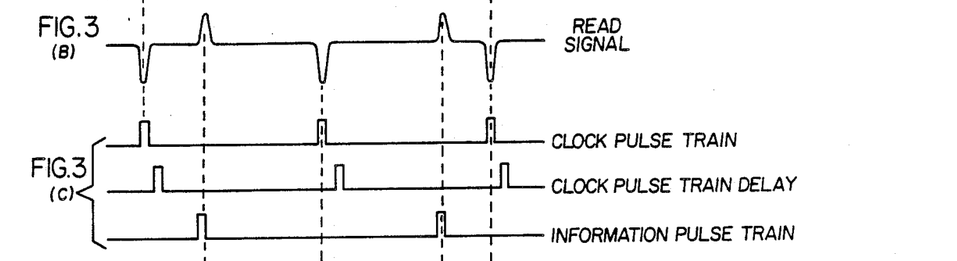

Continuing, the read signal comprising clock transition components, and first and second information components, as exemplified by FIG. 3B, is introduced into the FIG. 2 electronics: the pre-amplifier 16, the filter circuit 18, and the post-amplifier 20, for input along the line 22 to the detector means 24. For pedagogical purposes, it is assumed that the input waveform to the detector means 24, after the electronics, is substantially equivalent to that already shown in FIG. 3B.

The detector means 24, by way of the positive and negative threshold peak detectors 30, 32 respectively, interrogates the FIG. 3B read signal for positive and negative peaks, and produces separate first and second output signals. In particular, the output of the negative threshold peak detector 32, shown in FIG. 3C, is a first output clock pulse train comprising the succession of clock transition components; the output of the positive threshold peak detector 30, on the other hand, is a second output information pulse train (see FIG. 3C) comprising the first and second information components.

The separate first and second pulse trains input to a set of logic devices, namely, the flip-flop 36, the counter 50 and the computer 42. Taken conceptually as a whole, the operation of the logic devices follows a four-step procedure (see the timing diagrams FIG. 3):

(1) the re-creation of a first information-cell is initiated by a first clock pulse (FIG. 3C) from the detector means 24, which (i) sets the flip-flop 36 so that its output terminal Q is a logic high, and (ii) inputs to the computer 42, along the line 44;

(2) the flip-flop 36 action, in turn, by way of line 52, initiates the counter 50. Preferably, the counter 50 counts according to a first formula given by the FIG. 3 Table, i.e., it counts *up* by a formula (n+1) from [0000], [0001], [0010], etc.;

(3) the advent of an information pulse (FIG. 3C) from the detector means 24, along the line 34, clears the flip-flop 36 (Q goes to a logic low). This action, in turn, again by way of line 52, now initiates the counter 50 to count according to a preferred second formula given by the FIG. 3 Table, i.e., it now counts *down*, by a formula (n−1), from the last "up" count: [0001], [0000], [1111], [1110], [1101], etc. The most significant bit (MSB) of the last count is inputted along the line 64 to the computer 42;

(4) the advent of a subsequent clock pulse from the detector means 24 once again sets the flip-flop 36 to a logic high, clears the counter 50 (line 48), and inputs to the computer 42 (line 44), thus concluding the re-creation of the first information-cell.

The computer 42 may be programmed (see illustrative program set forth below) to signify whether the identified first information-cell is dedicated to a first or second information. Here, the signification is direct: the fact that the MSB on the input line 64 is a 1, signifies that the first information-cell is dedicated to an information 0 (cf. FIG. 3A). This is true for the following reason. An MSB of 1 means that in the count down (see FIG. 3 Table), the duration of the variable information-cell causes the counter to "roll-over" from [0000] to [1111]. In the further count down, until the information-cell elapses, the 1 in the MSB must always continue to appear, i.e., [1111], [1110], [1101], . . . [1001]. Further, the up and down counts, taken *together* as implied by an MSB=1, shows that the advent of the information pulse, which triggers the count down, must occur *before* the half-way point of the first information-cell, because otherwise, the MSB would remain a zero. But this fact, by definition of the Wash encoding method, means that the information 0 is encoded in the first information-cell.

The second information-cell subsumed in the FIG. 3A Wash encoded signal may be processed by the FIG. 2 circuit 10 in a manner, mutatis mutandis, with the just outlined four-step procedure. The only difference is that the MSB outputted on the line 64 to the computer 42 is now an MSB=0 (not a one). This is clear from the FIG. 3 table, and reflects the fact that an information 1 has been encoded in the second information-cell, rather than an information 0. Recall, the information 1 is located past the second information-cell line of demarcation half-way point, in fact, it is located at the ⅔rd point. Thus, although the advent of the information pulse at this ⅔ point causes the counter 50 to count down, the count cannot reach the counter 50 "roll-over" benchmark (i.e., the count [1111]). In other words, the MSB must remain a zero. The up and down counts, taken *together* as implied by an MSB=0, shows that the advent of the information pulse, which triggers the count down, must occur *after* the half-way point of the second information-cell. But this fact, by definition of the Wash encoding method, means that the information 1 is encoded in the second information-cell.

Additional instruction on the operation of the circuit 10, as it relates to the Wash method, is now disclosed.

First, the clock transitions in the FIG. 3A encoding example are negative, the information transitions are positive. In other encoding signals, not shown, these transition polarities may be respectively reversed, while still uniquely distinguishing the clock from information transitions. The electrical circuit 10 may be readily adapted to decode this alternative encoding signal.

Second, as indicated in the Summary above, the information transitions and line of demarcation of an encoded signal can be located at any predetermined information-cell location, with any change being readily accommodated by the circuit 10.

Third, the circuit 10 preferably employs the time delay 40, interposed between the detector means 24 and the flip-flop 36, to shift the clock transition pulse train by a predetermined time, as shown in FIG. 3C. This action obviates a potential ambiguity that clock pulses could occur simultaneously, hence ambiguously, with information pulses. Other techniques, among many, to avoid the indicated potential ambiguity, include using a leading and a trailing edge of the clock pulse to set the flip-flop 36, and input to the computer 42.

Figures 3D, 3E:
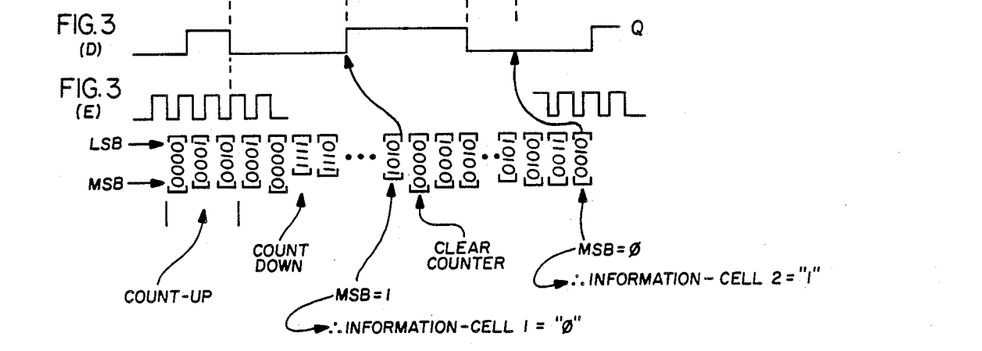

Fourth, the circuit 10 preferably employs a systems clock 56, inputting into the counter 50 along the line 54, for coordinating overall timing operations of the circuit 10. To this end, and in accordance with the well-known Nyquist frequency criteria, the systems clock 56 preferably (1) runs with a frequency at least 2n times as fast as the maximum information-cell velocity transfer rate, where n is defined by the Wash method ratio $t_d/t \neq 1/n$, and (2) runs with a maximum frequency $f_{max}$ defined by $$f_{max} = \frac{2^{(N-1)}}{\text{minimum information-cell transfer rate}},$$

where N is the number of bits in the counter 50. The systems clock 56 timing profile for the above embodiment is shown in FIG. 3E.

Fifth, while the counter 50 preferably employs the above disclosed first and second counting formulas, namely counting up and down by one, from a zero [0000] origin, it is possible to employ many other, alternative counting formulas. For example, the counter 50 can first count down by two's, from an arbitrary origin [wxyz], then count up by ones, at the advent of the information pulse. In these cases, of course, the MSB outputted by the counter 50 to the computer 42 may not immediately be the signification of a first or second information, and this must be factored, accordingly, into the computer 42 program.

Sixth, the FIG. 2 circuit 10 employs a discrete counter 50 that is independent of the computer 42. However, alternative embodiments simulate the counter 50 capabilities by way of an appropriately programmed computer 42.

Seventh, the circuit 10 makes use of, e.g., a counter, a computer, a read-write head, etc. Conventional such components can be used for this purpose including, for example, a Texas Instruments Model No. 74AS867 counter 50.

We now turn our attention to the operation of the FIG. 2 circuit in decoding a signal encoded pursuant to the Chi method.

Figure 4A:
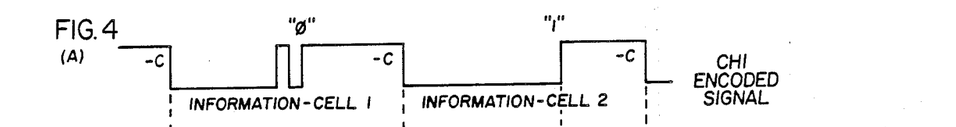
FIGS. 4A–E show waveforms generated by the FIG. 2 circuit, when decoding a Chi encoded signal.
Figure 4B:
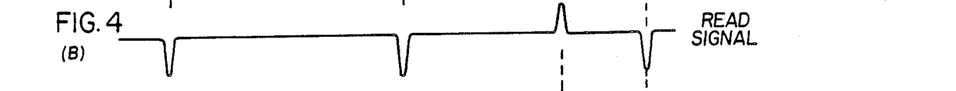
Figure 4C:
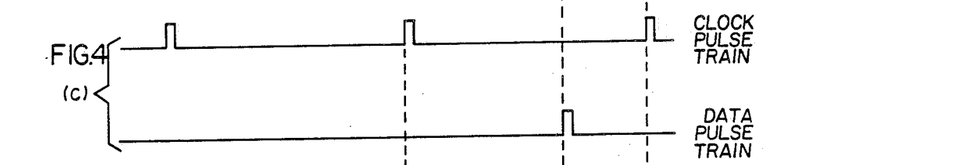

A representative Chi encoded signal has been discussed above (see FIG. 1B), and is now reproduced as FIG. 4A. The processing of the Chi encoded signal is entirely analogous to that of the Wash encoded signal, with the following noted exceptions. First, the read signal is of the form shown in FIG. 4B, i.e., the Chi method, in one of its embodiments, dictates that one of the two informations generates a read signal having a zero information magnitude. This, in turn, causes the detector means 24 to output information and clock pulse trains of the type shown in FIG. 4C, so that information-cells carrying a first information comprise *no* information components (e.g., pulses) between subsequent clock transition components. Note that it is this situation that has been contemplated above in the "proviso" language set forth in the Summary of the Invention. Information-cells comprising a second information, on the other hand, do comprise an information component (e.g., an information pulse) located between clock transition pulses.

The FIG. 2 circuit 10 comprising the flip-flop 36, the counter 50 and the computer 42, preferably responds to the Chi first and second informations in the following manner.

Figure 4D:
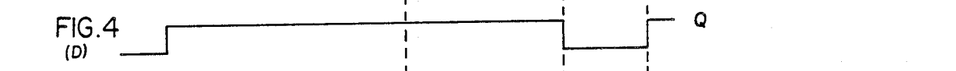
Figure 4E:
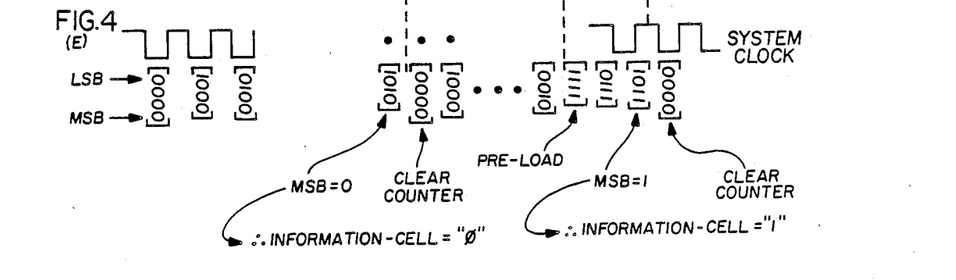

(1) For the FIG. 4A first information-cell comprising the first information 0, the counter 50 counts from the advent of an initiating clock transition pulse (FIG. 4C), according to a first formula (n+1): i.e., [0000], [0001], [0010] . . . . See the FIG. 4 Table. There is no intervening information pulse, so the count continues only according to the first formula, until the advent of a subsequent clock transition pulse. To this end, note the operation of the flip-flop 36 Q output, FIG. 4D, which ensures holding the counter 50 in its first formula counting mode. The MSB of the counter 50 is inputted to the computer 42 along the line 64. The computer 42 may be programmed in accordance with a second Program listed below, to provide signification of a first or second information in the first information-cell. For example, here the first information-cell comprising the information 0, correlates to an MSB=0.

(2) For the FIG. 4A second information-cell comprising the second information 1, on the other hand, the counter 50 counts from the advent of an initiating clock transition pulse (see FIG. 4c), according to the first formula (n+1). However, at the advent of the intervening information pulse at some arbitrary time encompassed by the second information-cell, the counter 50 starts to count down in accordance with a second formula (x−n−1), where x is an arbitrary loading factor. Again, see the FIG. 4 Table. This action is initiated by the flip-flop 36 in exactly the same way as for the Wash method, supra. The counter 50 continues to count down in accordance with the second formula, until the advent of a subsequent clock transition pulse, and inputs the MSB to the computer 42. The computer 42 may be programmed in accordance with the second Program listed below, to provide signification of the first or second information in the second information-cell. For example, here the second information-cell comprising the information 1, correlates to an MSB=1.

COMPUTER PROGRAMS

A first computer program in accordance with the requirements of the circuit 10 for the Wash method specified above, written in C language, is now listed.

```
****************************************************
FUNCTION: decode
PURPOSE:  To decode information received from up-down
          counter.
ASSUME:   Counter is an eight-bit register.
INPUT:    WHAT                HOW
          Serial clock value  Parameter - Clock
          Up-down counter value Parameter - Counter
OUTPUT:   WHAT                HOW
          Decoded data bit    Parameter - DataBit
RETURNS:  0 if Clock was LOW (nothing to decode),
          1 if Clock was HIGH (bit decoded).
****************************************************
#define MSB 0x80      /* Most significant bit of counter. */
int decode
    ( int       Clock,    /* Serial clock input.
      unsigned  Counter,  /* Current value of up-down counter.
      unsigned  *DataBit ) /* Value of decoded data bit.
    {
    if ( Clock == 0 )
        {
        /* Clock low -- nothing to decode. */
        return(0);
        }       /* and if */
    else if ( Counter & MSB )
        {
        /* Clock high, MSB high. */
        *DataBit = 0;
        return(1);
        }       /* end else if */
    else
        {
        /* Clock high, MSB low. */
        *DataBit = 1;
        return(1);
        }       /* end else */
    }   /* end decode */
```

A second computer program in accordance with the requirements of the circuit 10 for the Chi method specified above, written in C language, is now listed.

```
****************************************************
FUNCTION: decode
PURPOSE:  To decode information received from up-down
          counter.
ASSUME:   Counter is an eight-bit register.
INPUT:    WHAT                HOW
          Serial clock value  Parameter - Clock
          Up-down counter value Parameter - Counter
OUTPUT:   WHAT                HOW
          Decoded data bit    Parameter - DataBit
RETURNS:  1 if Clock was LOW (nothing to decode).
          0 if Clock was HIGH (bit decoded).
****************************************************
#define MSB 0x80      /* Most significant bit of counter. */
int decode
    ( int       Clock,    /* Serial clock input.
      unsigned  Counter,  /* Current value of up-down counter.
      unsigned  *DataBit ) /* Value of decoded data bit.
    {
    if ( Clock == 0 )
        {
        /* Clock low -- nothing to decode. */
        return(0);
        }       /* and if */
    else if ( Counter & MSB )
        {
        /* Clock high, MSB high. */
        *DataBit = 1;
        return(1);
        }       /* end else if */
    else
        {
        /* Clock high, MSB low. */
        *DataBit = 0;
        return(1);
        }       /* end else */
    }   /* end decode */
```

What is claimed is:

1. An electrical circuit suitable for decoding in real time binary data comprising first and second information; which data has been encoded into an encoded signal, the encoded signal comprising:
   (i) a succession of information-cells, each of which information-cells is demarcated by a pair of unique clock transitions capable of ocurring at variable time intervals and thereby define information-cells of varying time duration; and wherein
   (ii) each information-cell is dedicated to encoding either a first information or a second information; the electrical circuit comprising:
   (a) a reading means for reading the encoded signal and producing a read signal which corresponds to the encoded signal, so that the read signal comprises
   a succession of information-cells, each of which information-cells comprises a unique pair of clock transition components, and each of which information-cells comprises a first information component or a second information component;
   (b) a detector means for receiving and interrogating the read signal and producing separate first and second output signals, wherein
      (i) the first output signal comprises the succession of unique clock transition components, and
      (ii) the second output signal comprises the first and second information components;
   (c) a counting means connected to the detector means for
      (i) counting, by a predefined first formula, from a first clock transition component in the first output signal until the advent of an information component in the second output signal; and
      (ii) then counting by a predefined second formula, from the advent of the information component in the second output signal until the advent of a second clock transition component in the first output signal; and (iii) with the proviso that if there is no identifiable information component between subsequent clock transition components, then the counting between subsequent clock transition components is in accordance with the first formula; and (d) a computing means receiving inputs from the detector means and the counting means, for
   (i) identifying the succession of information-cells, and
   (ii) signifying each identified information-cell as being dedicated to either a first or second information, the signification based on a known relationship between the first and second formulas and the value of only a most significant bit generated by the counting means (c).

2. An electrical circuit according to claim 1, wherein the reading means comprises a magnetic reading head.

3. An electrical circuit according to claim 1, wherein the detector means comprises (i) a first threshold peak detector, which functions to interrogate the read signal for clock transition components, and to output a first pulse train signal in correspondence to said clock transition components; and (ii) a second threshold peak detector connected in parallel to the first threshold peak detector, which functions to interrogate the read signal for first and second information components, and to output a second pulse train signal in correspondence with said first and second informations.

4. An electrical circuit according to claim 1, wherein the counting means
   (i) counts up by a first formula (n+1) from the advent of the first clock transition component until the advent of the information component; and
   (ii) then counts down by a second formula (n−1) from the last count generated by the first formula until the advent of the second clock transition component.

* * * * *